(12) United States Patent
Liao et al.

(10) Patent No.: US 11,651,981 B2
(45) Date of Patent: May 16, 2023

(54) METHOD AND SYSTEM FOR MAP-FREE INSPECTION OF SEMICONDUCTOR DEVICES

(71) Applicant: Taiwan Semiconductor Manufacturing Co., Ltd., Hsin-Chu (TW)

(72) Inventors: Jiao-Rou Liao, New Taipei (TW); Sheng-Hsiang Chuang, Hsin-Chu (TW); Cheng-Kang Hu, Hsin-Chu (TW); Hsu-Shui Liu, Hsin-Chu (TW); Jiun-Rong Pai, Jhubei (TW); Shou-Wen Kuo, Hsinchu Cinty (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 273 days.

(21) Appl. No.: 16/996,211

(22) Filed: Aug. 18, 2020

(65) Prior Publication Data
US 2022/0059376 A1 Feb. 24, 2022

(51) Int. Cl.
*H01L 21/67* (2006.01)
*H04N 5/232* (2006.01)
*G01B 11/14* (2006.01)
*G06T 7/00* (2017.01)
*H04N 5/225* (2006.01)
*H04N 7/18* (2006.01)

(52) U.S. Cl.
CPC ........ *H01L 21/67288* (2013.01); *G01B 11/14* (2013.01); *G06T 7/001* (2013.01); *H04N 5/2256* (2013.01); *H04N 5/23299* (2018.08); *H04N 7/183* (2013.01); *G06T 2207/30148* (2013.01)

(58) Field of Classification Search
CPC ... H01L 21/67288; G01B 11/14; G01B 11/12; G01B 11/2408; G06T 7/001; G06T 2207/30148; G06T 2207/20168; G06T 7/0004; H04N 5/2256; H04N 5/23299; H04N 7/183; G01N 21/95684; G01N 21/9501; G01N 21/95607
See application file for complete search history.

(56) References Cited

U.S. PATENT DOCUMENTS

| | | | |
|---|---|---|---|
| 2009/0257646 A1* | 10/2009 | Moon | G01R 31/311 382/149 |
| 2017/0270656 A1* | 9/2017 | Ueba | G06T 7/001 |
| 2018/0366357 A1* | 12/2018 | Liao | H01L 21/68707 |
| 2020/0161081 A1* | 5/2020 | Pathangi | H01J 37/222 |
| 2021/0327678 A1* | 10/2021 | Maas | H01J 37/304 |

* cited by examiner

*Primary Examiner* — Richard A Hansell, Jr.
(74) *Attorney, Agent, or Firm* — Duane Morris LLP

(57) ABSTRACT

A system and method for defect detection in a hole array on a substrate is disclosed herein. In one embodiment, a method for defect detection in a hole array on a substrate, includes: scanning a substrate surface using at least one optical detector, generating at least one image of the substrate surface; and analyzing the at least one image to detect defects in the hole array on the substrate surface based on a set of predetermined criteria.

20 Claims, 17 Drawing Sheets

700

| Spec. Setting | |
|---|---|
| Roundness (um) | 0.1 — 702 |
| Raw Edge Spec. (um) | 10 — 704 |
| Bad (%) | 0.3 — 706 |
| Worse (%) | 0.5 — 708 |
| Worst (%) | 1.2 — 710 |
| Contamination (um) | 10 — 712 |
| um per Pixel | 1.19183 — 714 |

FIG.7

METHOD AND SYSTEM FOR MAP-FREE INSPECTION OF SEMICONDUCTOR DEVICES

BACKGROUND

In the semiconductor integrated circuit (IC) industry, there is a continuing demand for smaller device dimensions and higher circuit packing densities. This demand has driven the semiconductor industry to develop new materials and complex processes. Manufacturing an IC at such dimensions and complexity generally uses advanced techniques to inspect the IC at various stages of the manufacturing process for quality control purposes.

For example, when a feature (e.g., a gate/drain/source feature of a transistor, a horizontal interconnect line, or a vertical via, etc.) is to be formed on a wafer, the wafer typically goes through a production line which comprises multiple processing stations typically using different process tools to perform various operations such as cleaning, photolithography, dielectric deposition, dry/wet etching, and metal deposition, for example. Prior to being transferred to a next step (e.g., a next processing station) in the production line, the wafer is typically inspected for defects.

Currently, such defect inspection, which is manually performed by a human using an optical instrument to determine the scanning alignment and the presence of defect, is time-consuming resulting a low yield. Despite this long felt need, no suitable systems meeting these requirements are available.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

FIG. 7 illustrates a user interface of a software program that is used for post-processing surface images, in accordance with some embodiments of the present disclosure.

DETAILED DESCRIPTION OF EXEMPLARY EMBODIMENTS

Figure 1A:
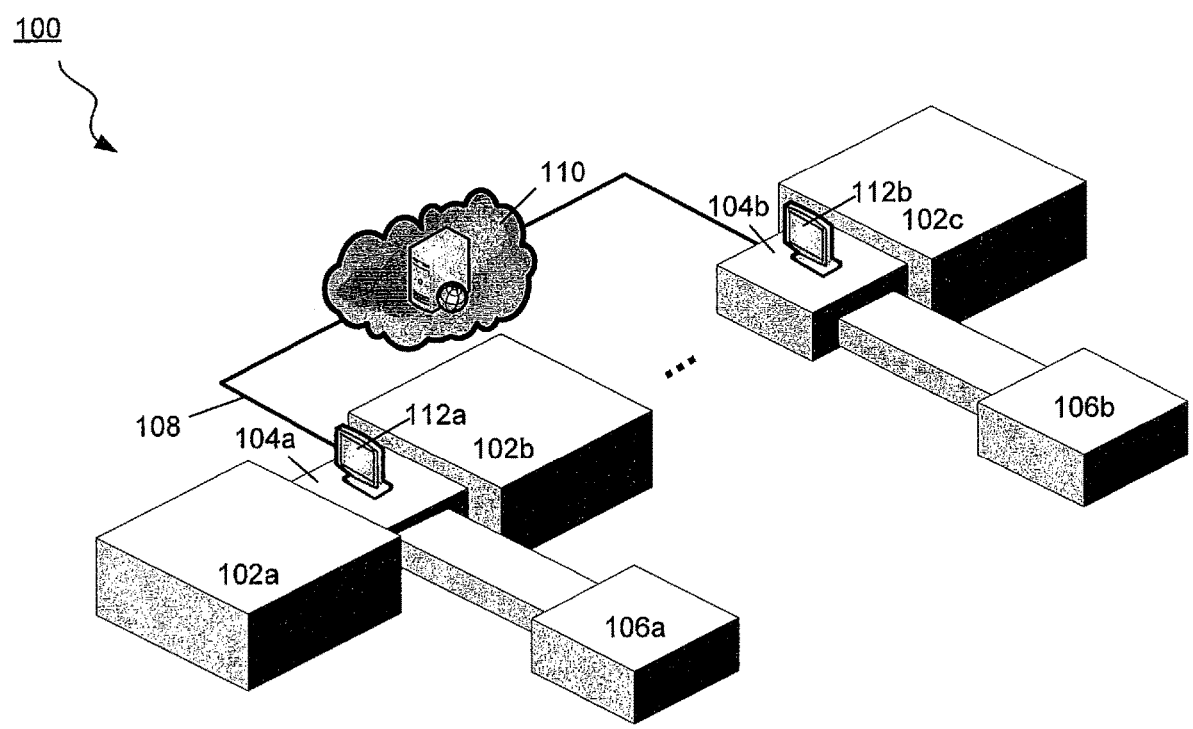
FIG. 1A illustrates a block diagram of a system integrating a plurality of inline inspection systems into a semiconductor manufacturing production line, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The presented disclosure provides various embodiments of a method and system for defect inspection in a hole array on a substrate. In contrast to the traditional scanning method, a system and method does not require manual alignment and provides flexibility in detecting defects in hole arrays with different physical geometries and configurations. Accordingly, the above-mentioned issues may be advantageously avoided.

This description of the exemplary embodiments is set to be understood in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

FIG. 1 illustrates a block diagram of a system 100 integrating a plurality of inline inspection systems into a semiconductor manufacturing production line according to one or more embodiments of the present disclosure. It is noted that the system 100 is merely an example, and is not intended to limit the present disclosure. Accordingly, it is understood that additional operations may be provided before, during, and after the system 100 of FIG. 1, and that some other operations may only be briefly described herein.

Referring to FIG. 1, the system 100 comprises a plurality of processing stations 102a, 102b and up to 102c (collectively referred to as processing station(s) 102 herein), a plurality of inspection systems 104a and 104b (collectively referred to as inspection system(s) 104 herein) located between respective processing stations 102, and a plurality of stockers 106a and 106b (collectively referred to has stocker(s) 106 herein) coupled to respective inspection systems 104. Examples of IC manufacturing processes conducted in processing stations 102 include cleaning, photolithography, wet etching, dry etching, dielectric deposition, metal deposition, and any processes known in the art. At least one feature can be created in each processing station 102 including a metal contact, an etch trench, an isolation, a via, an interconnect line and the like. In some embodiments, the at least one feature includes a hole.

At least two processing stations 102 are coupled to an intermediate inspection system 104, in which at least one wafer from one prior processing station 102 can be inspected before it is transported to the next processing station 102. For example, a processing station 102b is coupled to a prior processing station 102a through an inspection system 104a and is also coupled to a later processing station 102c through an inspection system 104b. At least one stocker 106 is coupled to each inspection system 104. For example, a stocker 106a is coupled to the inspection system 104a, in which a wafer with defects as determined by the inspection system 104a can be extracted from the production line and stored in the stocker 106a for reprocessing or rejection, instead of being transferred to the next processing station 102b.

As discussed in further detail below, in some embodiments, the inspection system 104 includes a wafer transport system (e.g., a conveyor) that transfers a wafer through the inspection station, a line scan camera, and a local computer with a storage unit and a display unit. For example, the wafer can be transferred on a conveyor in the inspection system 104a from processing station 102a to processing station 102b, or if a defect is detected to respective stocker 106a. While being transferred in the inspection system 104a, the surface of the wafer is imaged by the line scan camera. Data collected by the line scan camera can be stored in a storage unit of a local computer 112a followed by a preprocessing step. Examples of preprocessing can include reconstruction of the line images into a two-dimensional image of the wafer surface and various distortion corrections, as described in further detail below. As shown in FIG. 1, a second local computer 112b is coupled to the second inspection system 104b to store and preprocess data collected by the second inspection system 104b.

Each of the local computers 112a and 112b are generally or collectively referred to as local computer(s) 112 herein. The local computers 112 are each coupled to a remote computer resource 110 through a connection 108. In some embodiments, the connection 108 may include a Ethernet cable, an optical fiber, a wireless communication media, and/or other networks known in the art. It should be understood that other connections and intermediate circuits can be deployed between the local computers 112 and the remote computer resource 110 to facilitate interconnection.

In some embodiments, an image processing operation can be performed by the remote computer resource 110 to automatically compare design criteria with the collected image of the wafer surface in accordance with predetermined algorithms or rules concerning, e.g., diameter, roundness, raw edge, consumption, contamination, and the like. In some embodiments, the remote computer resource 110 includes a computer network, servers, applications, and/or data centers, generally known as the "cloud" or cloud computing. Results and decisions from the remote computer resource 110 about whether the wafer contains defects are processed and transmitted back to the local computer 112 associated with a respective inspection system 104 through the connection 108. In some embodiments, the remote computer resource 110 may be unnecessary if the local computer 112 can perform the image processing and analysis locally. In some embodiments, various inspection results (e.g., diameter, roundness, raw edge, consumption, and contamination, overlaid with design patterns) are displayed on a local display unit and, if the wafer is determined to be defective, a control signal is sent to the conveyor to transfer the wafer to a respective stocker 106. In some embodiments, a wafer that fails to meet a pre-defined threshold or criterion, and thus determined to be defective, is transferred by the conveyor in the inspection system 104a to a cassette in the stocker 106a for reprocessing or rejection. On the other hand, if the wafer is determined to be not defective meeting the pre-defined threshold or criterion, then it is transferred by the conveyor to the next processing station 102b for further processing. In some embodiments, the threshold may vary depending on the application and can be set by manufacturers.

Although the system 100 in the illustrated embodiment of FIG. 1 includes only three processing stations 102, two inspection systems 104, two stockers 106, two local computers 112 and one remote computer 110, it is understood that the illustrated embodiment of FIG. 1 is merely provided for illustration purposes. The system 100 may include any desired number of processing stations 102 with any desired number of inspection systems 104 and stocker 106 while remaining within the scope of the present disclosure. Furthermore, in some embodiments, an inspection system 104 can be coupled to two or more processing stations 102 and/or two or more stockers 106. In some embodiments, two or more inspection systems 104 may be located between two processing stations 102.

In some embodiments, a separate transfer chamber in the inspection station 104 can be coupled to a process chamber in the processing station 102. In some embodiments, for processes such as metal or dielectric deposition, for example, the inline camera of the inspection system 104 is separated from the deposition chamber of the processing station to protect the camera and other components of the inspection system 104 from deposition of materials, or extreme conditions, e.g., high temperature heating and ion bombardment. In some embodiments, the transfer chamber of the inspection system 104 can maintain a vacuum seal between two vacuum process chambers or purged with high purity inert gas (e.g., Ar and $N_2$) to provide an inert atmosphere for air sensitive wafers during the transferring process. In some embodiments, the inspection system 104 may be configured inside the process chamber of the processing station 102, if the process does not interfere with the inspection. Such an integration of inspection systems to an existing semiconductor manufacturing production line provides an inline inspection that can efficiently detect and map the defects of entire wafer, without relying on manual inspection or statistical sampling of the wafer surface. By mapping the defects of the wafer after each processing stage, as part of the inline manufacturing process, critical insights into process characteristics (e.g., tools and conditions) of each stage can be obtained while minimizing adverse effects on throughput.

Figure 1B:
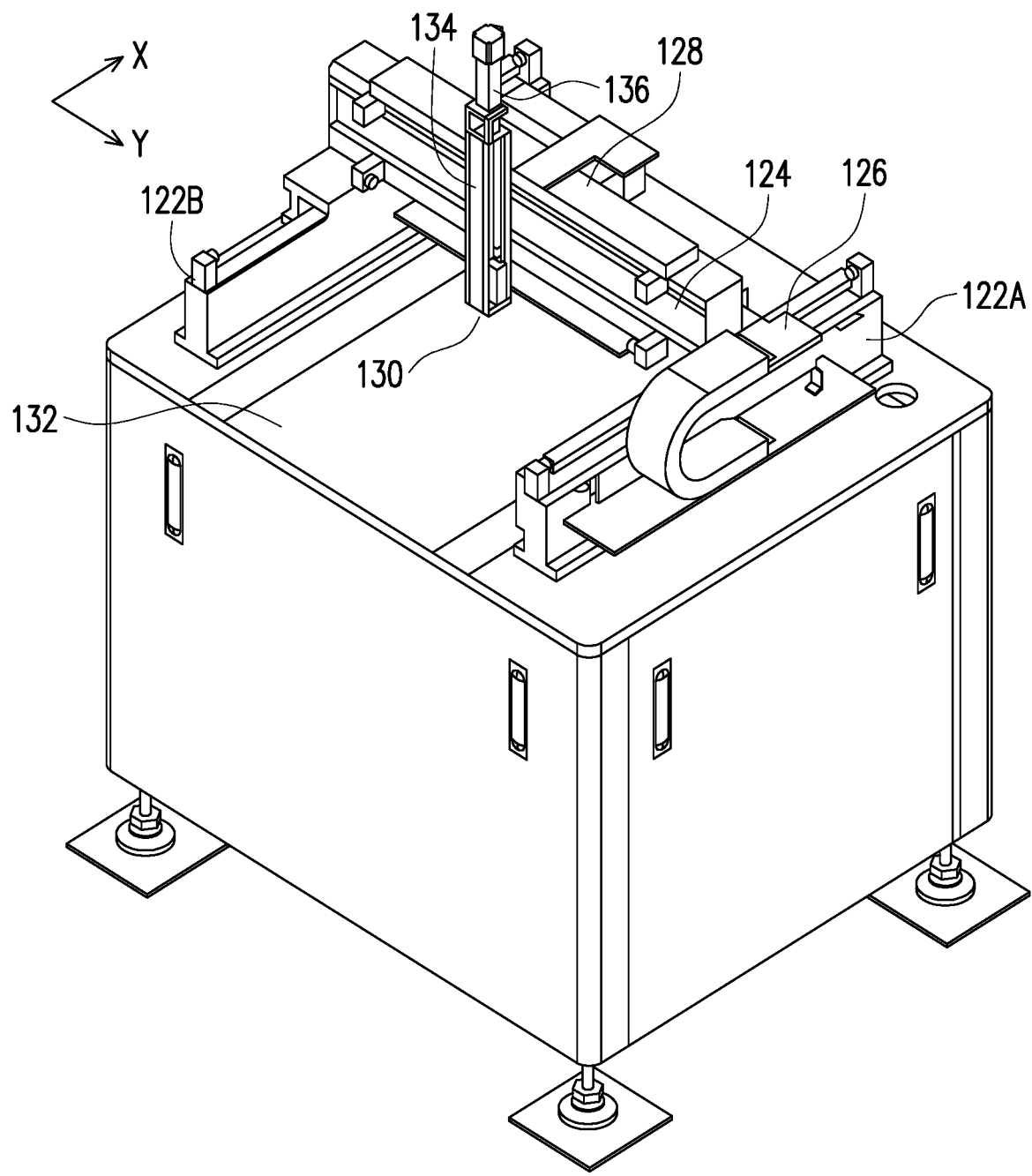
FIG. 1B illustrates a schematic of an inspection system for scanning a surface, in accordance with some embodiments.

FIG. 1B illustrates a schematic of an inspection system 104 for scanning a surface, in accordance with some embodiments. The inspection system 104 comprises a pair of tracks 122A and 122B that guide a movement of an optical detector 130 in a first horizontal direction (i.e., X-direction), and a track 124 that guides a movement of the optical detector 130 in a second horizontal direction (i.e., Y-direction) that is normal to the first horizontal direction (e.g., X-direction). In some embodiments, the optical detector 130 is a line scan camera. The X-Y plane can be parallel to the plane of a stage 132, on which a part to be inspected can be placed. Motors 126 and 128 provide linear movements in the X- and Y-direction such that the optical detector 130 in the X-Y plane can scan the surface of a wafer (not shown) on the stage 132. In some embodiments, the optical detector 130 can also move in a third vertical direction (e.g., Z-direction) that is perpendicular to the X-Y plane on a track 134 controlled by a motor 126. In some embodiments, the motors 126, 128, and 136 can be linear electric motors providing high speed linear motion and accurate position control of the optical detector 130. In some embodiments, a plurality of optical detectors 130 can be used to scan complex surfaces to simultaneously scan multiple wafers or multiple locations on a same surface. In some other embodiments, the wafer under inspection can be moved on a conveyor stage/a robot arm, while the optical detector 130 is fixed.

As mentioned above, FIGS. 2A-2C illustrate a variety of perspective views of an inspection system 200, in accordance with some embodiments of the present disclosure. These are, of course, merely examples and are not intended to be limiting.

Figure 2A:
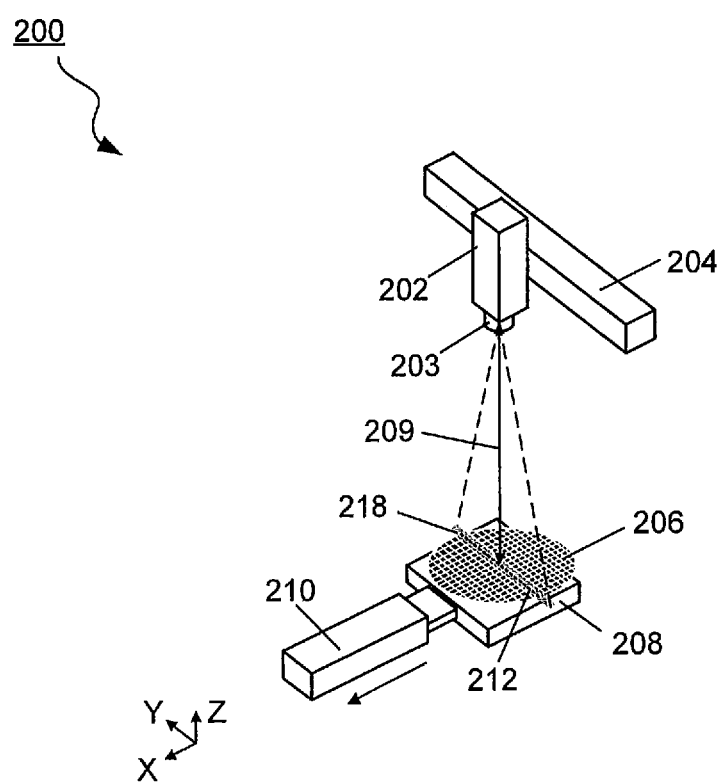
FIG. 2A illustrates a perspective view of an inspection system, in accordance with some embodiments.

FIG. 2A illustrates a perspective view of an inspection system 200, in accordance with some embodiments. In one embodiment, a wafer 206 is secured by a suitable wafer holder 208 coupled to a conveyor, e.g., a motorized robotic transfer arm 210. The robotic transfer arm 210 is translatable in both the X and Y directions. In some embodiments, the robotic transfer arm 210 is also rotatable about a certain center in the X-Y plane. In the illustrated embodiment, the wafer holder 208 coupled to the robotic transfer arm 210 transfers the wafer 206 along the X axis at a constant speed during scanning.

In the embodiment shown in FIG. 2A, a line scan camera 202 with an imaging lens 203 is mounted on a frame 204 located at a certain working distance 209 from the surface of the wafer 206 in the vertical (Z) direction. In some embodiments, these three parts, i.e., 202, 203 and 204, are stationary. In some embodiments, a diffused illumination from a remotely located light source (not shown) can be used, which can provide sufficient light for the line scan camera 202 to capture high-resolution images of the wafer 206. In some embodiments, the position of the frame 204 and the line scan camera 202 relative to the wafer 106 can be adjusted for alignment purpose.

In some embodiments, instead of capturing an image of the entire wafer as a whole, the line scan camera 202 collects image data one scan line at a time. An image line 212, indicated by a short dashed line in FIG. 2A, is a line region where the reflected or scattered light from the surface of the wafer under inspection is collected by a light sensor in the line scan camera 202 through the imaging lens 203. In some embodiments, the field of view 218 of the line scan camera 202 in the Y direction, e.g., the maximum length of the image line 212, can be adjusted by the width of the light sensor in the line scan camera 202, the working distance 209, and the focal length of the lens 203. In some embodiments, the image line 212 is the overlap portion of the field of view 218 in Y direction and the surface of the wafer 206. For example, the width of imaging lens can be 25 millimeters (mm), which can provide a field of view 218 with a width of up to 215 mm in the Y direction and a sensor width of 14 mm. Therefore, the resolution in the Y direction, which has a unit in mm per pixel for a light sensor width of 1024 pixels per line, can be controlled by the working distance 209 taking into account the diameter of the wafer 206. In some other embodiments, the line scan cameras comprising light sensors with different width and numbers of pixels can be used and are within the scope of this disclosure. In some embodiments, the resolution that such system can provide is 9 micrometer.

In some embodiments, the line scan camera 202 includes a light sensor that can be based on a variety of technologies such as, for example, a charge-coupled detector (CCD), a complementary metal-oxide-semiconductor (CMOS), or a hybrid CCD/CMOS architecture. In some embodiments, the light sensor can be a mono or color sensor. In some embodiments, such light sensor can be configured to either work in a broad range of wavelengths or a narrow range of wavelengths e.g., ultraviolet light, visible light, infrared light, x-ray and/or other appropriate wavelengths. In some other embodiments, such light sensor can be configured to receive either reflected and/or scattered non-fluorescence light from a light source or a fluorescence light emitted by the defects or features due to an excitation by the light source.

In some embodiments, the wafer 206 includes a silicon substrate. Alternatively, the wafer 206 may include other elementary semiconductor material such as, for example, germanium. The substrate may also include a compound semiconductor material such as silicon carbide, gallium arsenide, indium arsenide, and indium phosphide. Furthermore, the wafer 206 may include an alloy semiconductor material such as silicon germanium, silicon germanium carbide, gallium arsenic phosphide, and gallium indium phosphide. Each material may interact differently with the incident light from the light source due to different material properties, e.g., refractive index and extinction coefficient, which can affect the design of the illumination source and the light sensor, e.g., wavelength, sensitivity and mode (e.g., scattered, reflected light or fluorescence light), as well as the speed of the conveyor.

The wafer 206 may contain at least one feature to be optically inspected. In some embodiments, the wafer 206 may include trenches from dry/wet etching of a dielectric material including fluorinated silica glass (FSG), phosphosilicate glass (PSG), borophosphosilicate glass (BPSG), polyimide, and/or other future developed low-k dielectric materials. In some embodiments, the wafer 206 can also include conductive features such as, for example horizontal interconnect lines or vertical vias from processes like chemical vapor deposition (CVD), physical vapor deposition (PVD), spin-on coating and the like. In some embodiment, the design of the illumination source, light sensor, and imaging lens 203 can be also affected by the physical dimension of these materials on the wafer 206, e.g., thickness and roughness, in combination with the material property of the wafer 206 and the materials on top, due to phenomena such as, for example interference effect and antireflection effect.

Figure 2B:
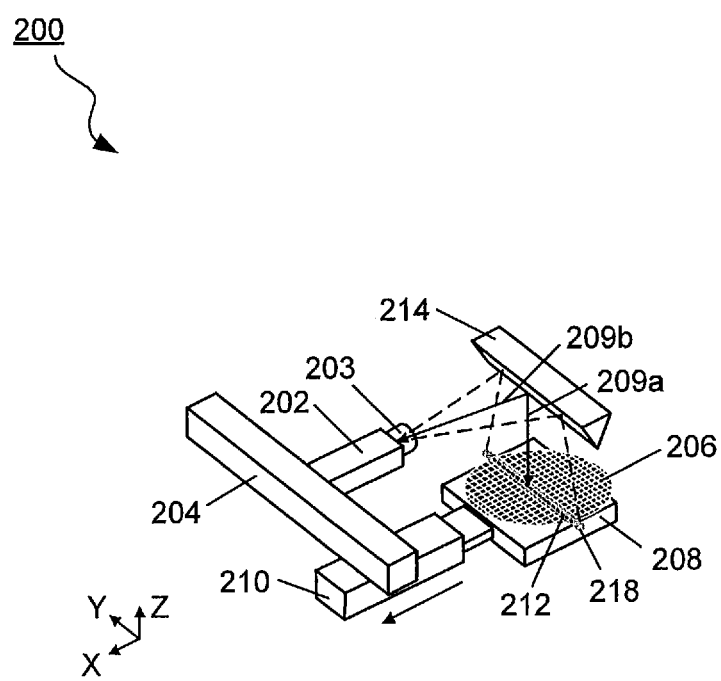
FIG. 2B illustrates a perspective view of an inspection system, which includes a reflective mirror, in accordance with some embodiments.

FIG. 2B illustrates a perspective view of an inspection system 200, in accordance with some embodiments of the present disclosure. In some embodiments, a reflective mirror 214 can reflect the non-fluorescent light and/or the fluorescent light from the image line 212 on the surface of the wafer 206 to the light sensor in the line scan camera 202 through lens 203. Since the optical pathway can be folded with a portion in the X direction parallel to the transfer direction of the wafer 206, the use of the reflective mirror 214 can allow the use of inspection system 200B in applications where a large space in the Z direction is not available, e.g., the total height of a transfer chamber is smaller than the summation of the working distance 109 and the length of the line scan camera 102. In some embodiments, the position in the X-Z plane and the tilt angle (i.e., rotation) along the Y axis of the reflective mirror 114 can be adjusted for alignment purpose. The configuration presented in FIG. 2B is merely for illustration purpose and is not intended to be limiting. For example, a plurality of reflective mirrors can be used to provide a desired optical path in order to direct the light to a desired direction. In some embodiments, the reflective mirror 214 is flat to prevent distortion of reflected light caused by the surface of the reflective mirror 214. For example, the reflective mirror 214 comprises a surface corrugation level in a range less than or equal to 20 micron/ 20 millimeter (μm/mm) and a surface curvature in a range equal to or less than 0.1 mm/100 mm.

Figure 2C:
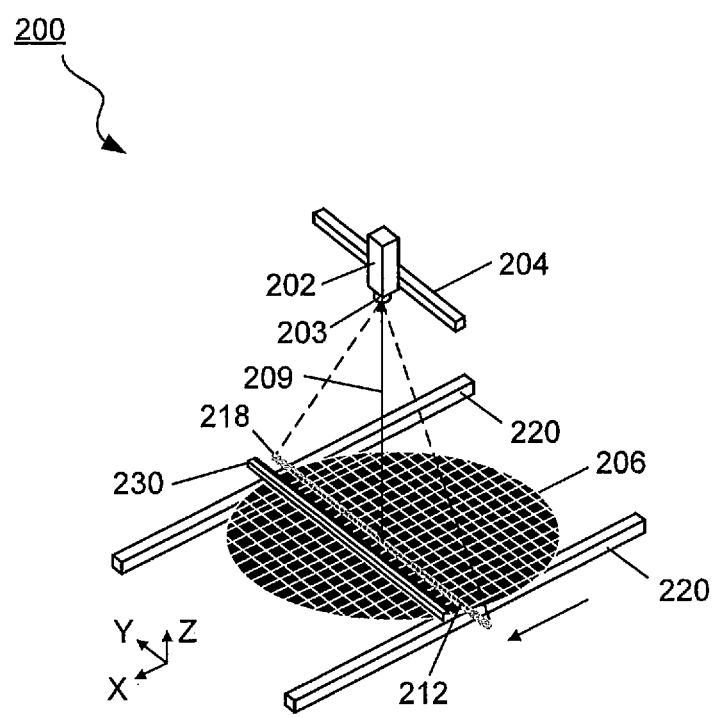
FIG. 2C illustrates a perspective view of an inspection system, which includes a reflective mirror, in accordance with some embodiments.

FIG. 2C illustrates a perspective view of an inline inspection system 200, in accordance with some embodiments of the present disclosure. In some embodiments, the light sensor in the line scan camera 202, the working distance 209, and the imaging lens 203 can be configured to assure the width of the field of view 218 in the Y direction is equal or greater than the diameter of the wafer 206. In some embodiments, the wafer 206 can be transported on a pair of tracks 220, as shown in FIG. 2C.

Because of the requirement for a wide field of view 218, when a large wafer is inspected especially within a limited space, a uniform intensity from a flood light source illumination becomes difficult. As mentioned above, since the image line 212 is the only portion of the wafer that needs to be uniformly illuminated for collecting line-scan images by the line scan camera 202, the illumination to the image line 212 can be from a line light source 230 having a narrow slit to direct a light beam. In some embodiments, the line light source 230 can include an array of light emitting diodes (LEDs) with a half bar converging line lens as an optical guide. Such a light source may be configured in the limited space while maintaining a uniform illumination to the image line 212 on the wafer 206. However, in accordance with various embodiments, various light sources suitable for various applications may be utilized. In another embodiment, an imaging lens 203 with a larger diameter, a smaller focal length, and/or a large refractive index can be used to provide a wide field of view 218 at a small working distance 209. To obtain a comparable resolution (mm per pixel) to that on a smaller wafer, a camera with a larger sensor size may be used. In some embodiments, the optical pathway can be redirected by a reflective mirror or a plurality of reflective mirrors e.g., an array of reflective mirrors (not shown) to accommodate the inspection system in certain applications.

Figure 2D:
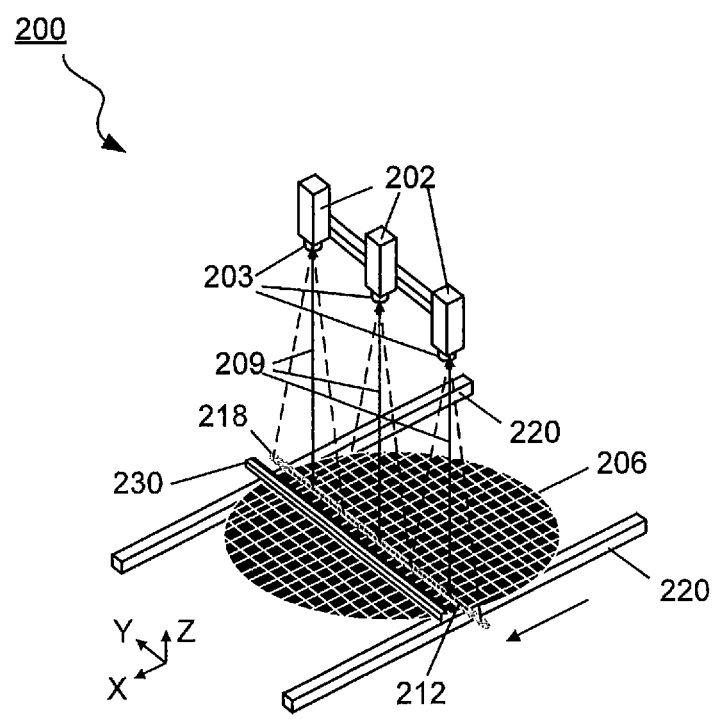
FIG. 2D illustrates a perspective view of an inspection system, which includes a reflective mirror, in accordance with some embodiments.

FIG. 2D illustrates a perspective view of an inline inspection system 200, in accordance with some embodiments of the present disclosure. In some embodiments, a plurality of line scan cameras 202 are used to scan the same surface of a wafer 206 with a large diameter. In some embodiments, the wafer 206 can be transported on a pair of tracks 220, as shown in FIG. 2D. In some embodiments, each of the plurality of optical detector 202 is configured to scan a portion of the surface of the wafer 206. In some embodiments, a plurality of line scan images from each of the plurality of line scan cameras 202 are the merged together using the position information of the wafer 206 based on a preconfigured algorithm.

In some embodiments, the relative position between the line scan camera 202 and the light source 230 can affect the inspection criteria. For example, in case of using a linear light source 230 on a wafer 206 with a reflective surface, when the line scan camera 202 is off the angle of reflection, the reflective surface appears dark in the light sensor while the features and/or defects can scatter light and appear bright in the image. For another example, when the line scan camera 202 is within the angle of reflection of the incident light from the light source 230, the surface appears bright while the features and/or defects may appear darker or brighter depending on their reflectivity relative to the rest of the surface.

In some embodiments, the conveyor can be a transfer robot which consists of multiple joints, a single arm, and a stage. In some embodiments, the transfer robot can provide high-speed and high-accuracy wafer handling within a limited space. As discussed above, a surface inspection using the line scan camera 202 requires a linear motion of the wafer 206 in a direction perpendicular to the axis of the image line 212. In some embodiments, the inline inspection system 200 with the line scan camera 202 can be configured to focus on one portion of a wafer transfer pathway where such linear relative motion between the wafer 206 and the image line 212 can be provided by a combination of moving parts of the transfer robot (e.g., rotation of joints and linear motion of arm and the stage).

In some embodiments, such inspection system can be combined with other functional inspection processes either inline or offline for additional function yield tests, e.g., electrical conductivity measurements. Although the above-illustrated inline defect detection system includes only one line scan camera (e.g., 202 in FIGS. 2A-2D), any desired number of line scan cameras can be combined in the inspection system, e.g., working in different ranges of wavelength and simultaneously detect different defects (e.g., size, distribution, and materials), while remaining within the scope of the present disclosure.

Figure 3A:
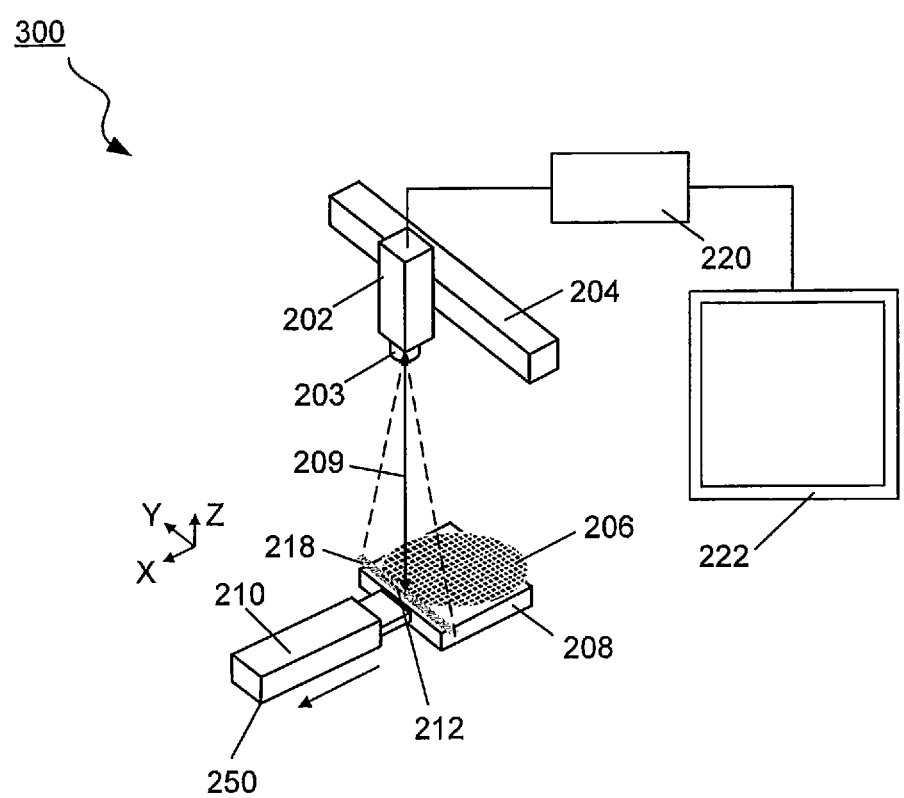
FIGS. 3A-3C illustrate perspective views of a system for scanning a substrate surface while the substrate is transferred by a conveyor through a field of view of a line scan camera, in accordance with some embodiments of the present disclosure.
Figure 3B:
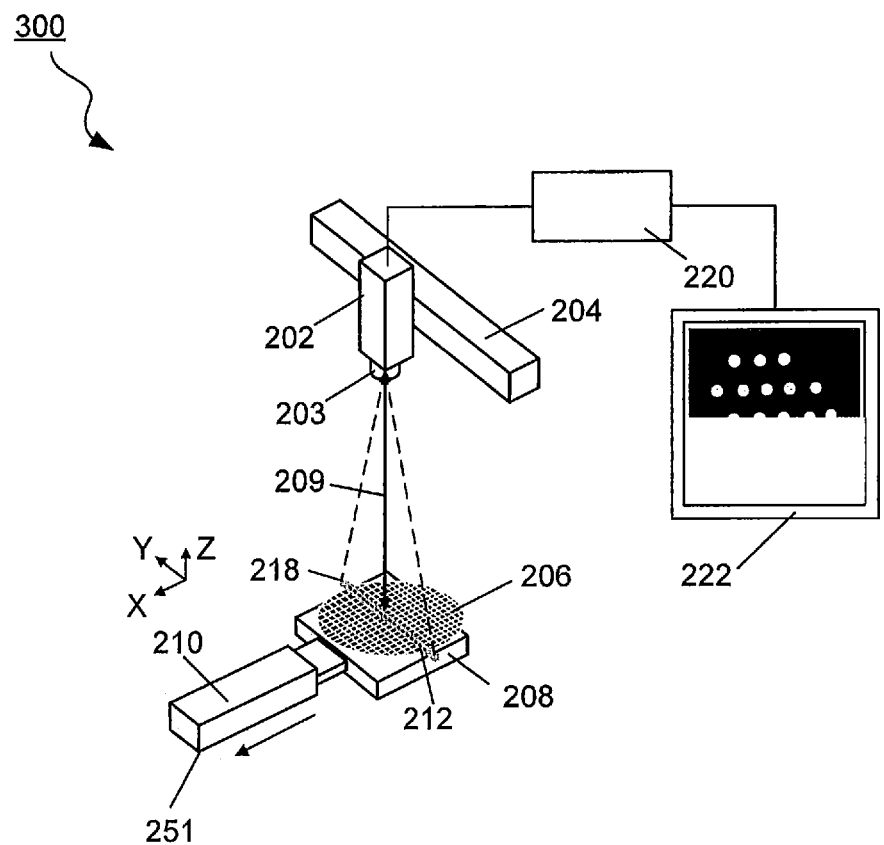
Figure 3C:
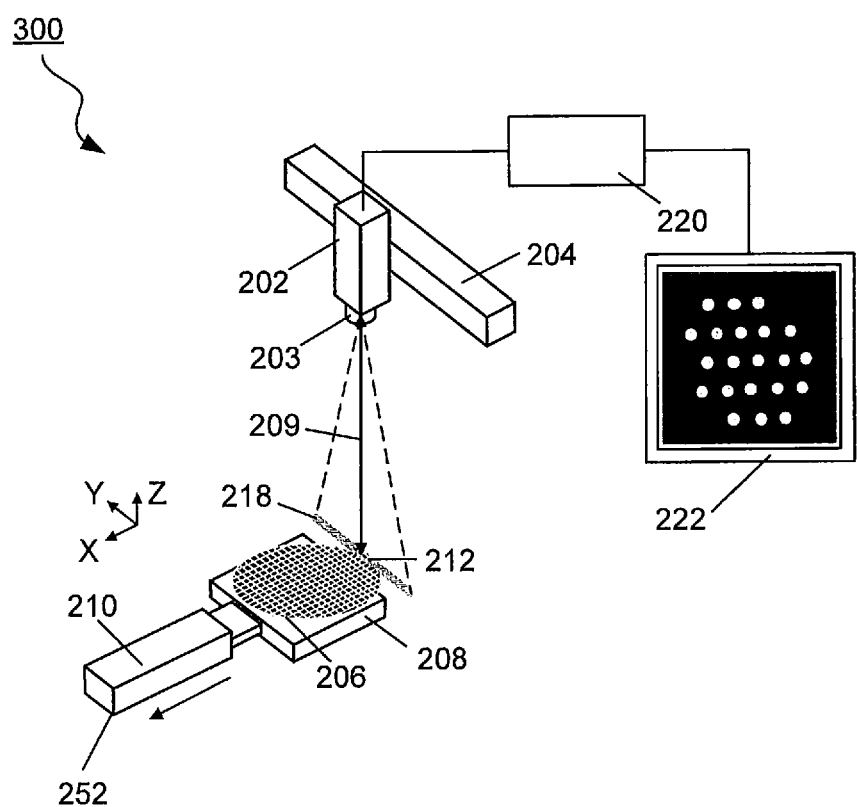

FIGS. 3A-3C illustrate perspective views of a system 300 for scanning a substrate surface while the substrate is transferred by a conveyor through a field of view of a line scan camera, in accordance with some embodiments of the present disclosure.

The system 300 first scans the wafer 206 at a first position 250 of the wafer 206 controlled by the conveyor 208/210, as shown in FIG. 3A. In the first position 250, the scan of the wafer surface is initiated, in accordance with some embodiments. As the wafer 206 enters the field of view 218 in Y direction, a recording cycle of a line scan image from the line scan camera 202 by a local computer 220 is initiated. In some embodiments, the recording can be also initiated by a position signal from an encoder that is located on a motor of the robotic transfer arm 210. In some embodiments, image data as the scanning progresses is shown on a display monitor 222 coupled to the local computer 220. As shown in FIG. 3A, at the beginning of the scanning process, no image data is yet available for display on the display monitor 222.

In some embodiments, such recording process of one single line of pixel from the line scan camera 202 to the local computer 220 is conducted in two steps, i.e., exposure and readout steps. In some embodiments, the recording process of a plurality of lines of pixels from the line scan camera 202 is conducted. In the first step, the line scan camera 202 collects a single line of pixels per exposure at one position which is initiated by the application of a trigger pulse to the camera, as discussed above. The trigger pulse also ends the exposure period and starts the second step of transferring the sensor image information to a readout register and finally out of the camera to the local computer, to complete the readout step. In some embodiments, the sensor image information is provided to the local computer 220 one line of pixels at a time. In some other embodiments, the line scan camera 202 collects a plurality of line of pixels per exposure at one position.

In some embodiments, the exposure time of an individual line at the image line 212 and the number of lines can be affected by the velocity of the wafer 206 and resolution requirement along the X axis in the wafer plane. In some embodiment, the exposure time may also be affected by illumination intensity, sensitivity of the light sensor, and type of defects being detected. In parallel with the first readout period, the line scan camera 202 continues with the next exposure step in a next cycle, while the robotic transfer arm 210 moves the wafer 206 to the next position.

The system 300 continues a second position 251 where a partial scan of the wafer surface of interest is completed, as shown in FIG. 3B, in accordance with some embodiments. In some embodiments, reconstruction of the image of the wafer surface under inspection is conducted based on a plurality of single line images through the local computer 220 and the surface image is then displayed on the display unit 222 in real time, as shown in FIG. 3B.

Once the surface of the wafer under inspection has been completely scanned at a third position 252, as illustrated in FIG. 3C, the local computer 220 then proceeds to reconstruct and preprocess the complete two-dimensional surface image to prepare the image for defect detection. In some embodiments, such preprocessing of the surface image includes offset correction, gain correction, distortion correction, adjusting contrast, and the like. In accordance with some embodiments, the reconstructed image is displayed on the display unit 222, as shown in FIG. 3C.

Figure 4:
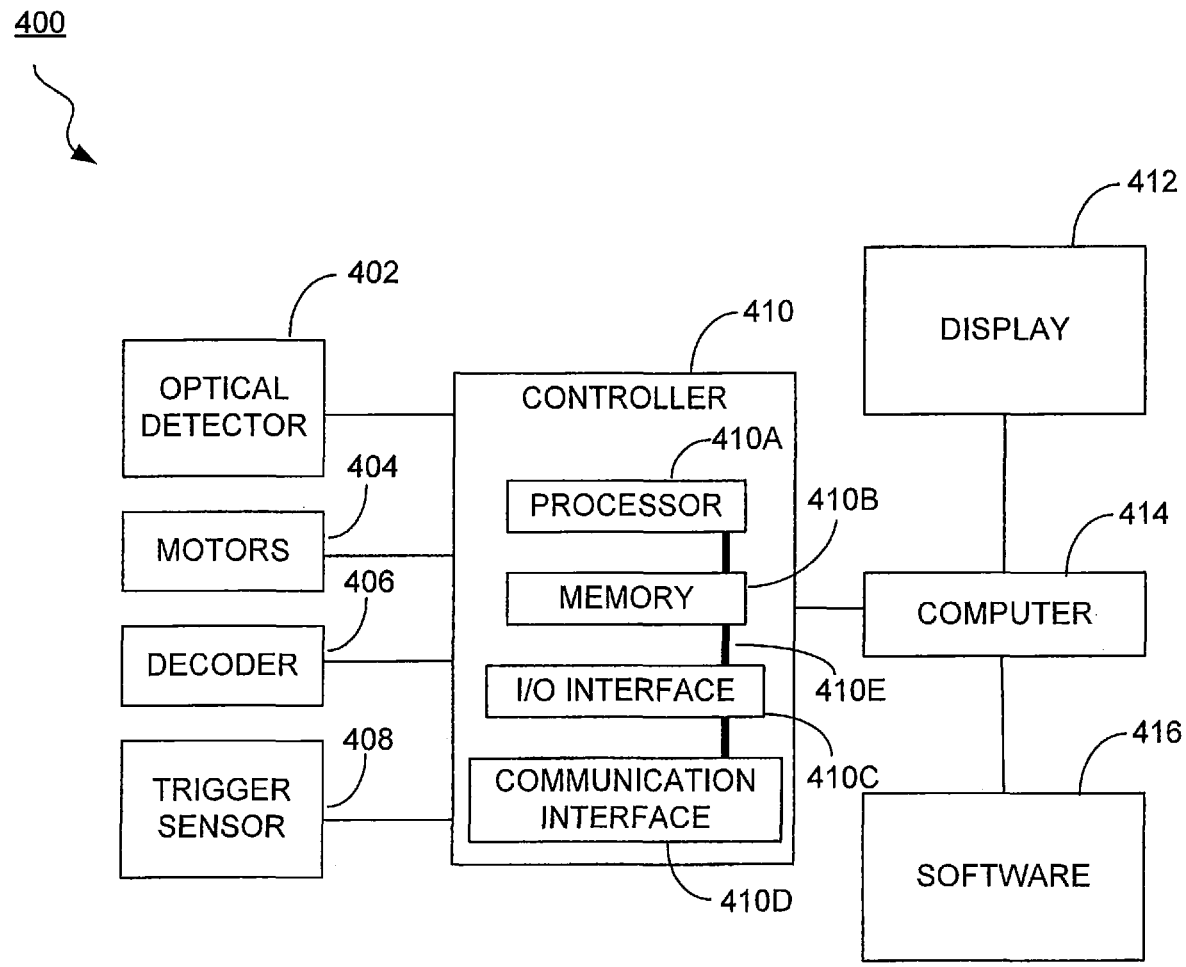
FIG. 4 illustrates a block diagram of an inspection system for scanning a surface of a wafer, in accordance with some embodiments of the present disclosure.

FIG. 4 illustrates a block diagram of an inspection system 400 for scanning a surface of a wafer, in accordance with some embodiments of the present disclosure. In the illustrated embodiment, the system 400 comprises at least one line scan camera 402, a plurality of motors 404 that can control the movement of the line scan camera in the X-Y direction as shown in FIG. 1 or the wafer in the X-Y direction as shown in FIGS. 2A-2D. An additional motor 404 can be used for the adjustment of the position of the line scan camera 402 in the Z-direction, in accordance with some embodiments, to accommodate the use of the mechanical system with different detectors with different field of view or working distances. At least one decoder 406 is installed on a plurality of tracks to provide position data. In some embodiments, at least one trigger sensor 408 can be also used to trigger a scan. In some embodiments, a digital camera can be also used to guide the positioning of the line scan camera 402 to the position such as a starting point or an area of interest.

A controller 410 in the system 400 for scanning a surface is a representative device and may comprise a processor 410A, a memory 410B, an input/output interface 410C (hereinafter "I/O interface"), a communications interface 410D, and a system bus 410E. In some embodiments, components in the controller 410 in the system 400 may be combined or omitted such as, for example, not including the communications interface 410D. In some embodiments, the controller 410 of the system 400 may comprise other components not combined or comprised in those shown in FIG. 4. For example, the controller 410 of the system 400 also may comprise a power subsystem providing power to the light source. In other embodiments, the controller 410 of the system 400 may comprise several instances of the components shown in FIG. 4.

The processor 410A may comprise any processing circuitry operative to control the operations and performance of the controller 410 of the system 400. In various aspects, the processor 410A may be implemented as a general purpose processor, a chip multiprocessor (CMP), a dedicated processor, an embedded processor, a digital signal processor (DSP), a network processor, an input/output (I/O) processor, a media access control (MAC) processor, a radio baseband processor, a co-processor, a microprocessor such as a complex instruction set computer (CISC) microprocessor, a reduced instruction set computing (RISC) microprocessor, and/or a very long instruction word (VLIW) microprocessor, or other processing device. The processor subsystem 406 also may be implemented by a controller, a microcontroller, an application specific integrated circuit (ASIC), a field programmable gate array (FPGA), a programmable logic device (PLD), and so forth.

In various aspects, the processor 410A may be arranged to run an operating system (OS) and various applications. Examples of an OS comprise, for example, operating systems generally known under the trade name of Apple OS, Microsoft Windows OS, Android OS, and any other proprietary or open source OS. Examples of applications comprise, for example, a telephone application, a camera (e.g., digital camera, video camera) application, a browser application, a multimedia player application, a gaming application, a messaging application (e.g., email, short message, multimedia), a viewer application, and so forth.

In some embodiments, at least one non-transitory computer-readable storage medium is provided having computer-executable instructions embodied thereon, wherein, when executed by at least one processor, the computer-executable instructions cause the at least one processor to perform embodiments of the methods described herein. This computer-readable storage medium can be embodied in the memory 410B.

In some embodiments, the memory 410B may comprise any machine-readable or computer-readable media capable of storing data, including both volatile/non-volatile memory and removable/non-removable memory. The memory 410B may comprise at least one non-volatile memory unit. The non-volatile memory unit is capable of storing one or more software programs. The software programs may contain, for example, applications, user data, device data, and/or configuration data, or combinations therefore, to name only a few. The software programs may contain instructions executable by the various components of the controller 410 of the system 400.

For example, memory 410B may comprise read-only memory (ROM), random-access memory (RAM), dynamic RAM (DRAM), Double-Data-Rate DRAM (DDR-RAM), synchronous DRAM (SDRAM), static RAM (SRAM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

In one embodiment, the memory 410B may contain an instruction set, in the form of a file for executing a method of generating one or more timing libraries as described herein. The instruction set may be stored in any acceptable form of machine readable instructions, including source code or various appropriate programming languages. Some examples of programming languages that may be used to store the instruction set comprise, but are not limited to: Java, C, C++, C#, Python, Objective-C, Visual Basic, or .NET programming. In some embodiments a compiler or interpreter is comprised to convert the instruction set into machine executable code for execution by the processor 410A.

In some embodiments, the I/O interface 410C may comprise any suitable mechanism or component to at least enable a user to provide input to the controller 410 and the controller 410 to provide output to the user. For example, the I/O interface 410C may comprise any suitable input mechanism, including but not limited to, a button, keypad, keyboard, click wheel, touch screen, or motion sensor. In some embodiments, the I/O interface 410C may comprise a capacitive sensing mechanism, or a multi-touch capacitive sensing mechanism (e.g., a touch screen).

In some embodiments, the I/O interface 410C may comprise a visual peripheral output device for providing a display visible to the user. For example, the visual peripheral output device may comprise a screen such as, for example, a Liquid Crystal Display (LCD) screen, incorporated into the controller 410 of the system 400. As another example, the visual peripheral output device may comprise a movable display or projecting system for providing a display of content on a surface remote from the controller 410 of the system 400. In some embodiments, the visual peripheral output device can comprise a coder/decoder, also known as a Codec, to convert digital media data into analog signals. For example, the visual peripheral output device may comprise video Codecs, audio Codecs, or any other suitable type of Codec.

The visual peripheral output device also may comprise display drivers, circuitry for driving display drivers, or both. The visual peripheral output device may be operative to display content under the direction of the processor 410A. For example, the visual peripheral output device may be able to play media playback information, application screens for application implemented on the controller 410 of the topological scan system 400, information regarding ongoing communications operations, information regarding incoming communications requests, or device operation screens, to name only a few.

In some embodiments, the communications interface 410D may comprise any suitable hardware, software, or combination of hardware and software that is capable of coupling the controller 410 of the system 400 to one or more networks and/or additional devices (such as, for example, the optical detector 242, motor 404, decoder 406, and trigger sensor 408). The communications interface 410D may be arranged to operate with any suitable technique for controlling information signals using a desired set of communications protocols, services or operating procedures. The communications interface 410D may comprise the appropriate physical connectors to connect with a corresponding communications medium, whether wired or wireless.

Systems and methods of communication comprise a network, in accordance with some embodiments. In various aspects, the network may comprise local area networks (LAN) as well as wide area networks (WAN) including without limitation Internet, wired channels, wireless channels, communication devices including telephones, computers, wire, radio, optical or other electromagnetic channels, and combinations thereof, including other devices and/or components capable of/associated with communicating data. For example, the communication environments comprise in-body communications, various devices, and various modes of communications such as wireless communications, wired communications, and combinations of the same.

Wireless communication modes comprise any mode of communication between points (e.g., nodes) that utilize, at least in part, wireless technology including various protocols and combinations of protocols associated with wireless transmission, data, and devices. The points comprise, for example, wireless devices such as wireless headsets, audio and multimedia devices and equipment, such as audio players and multimedia players, telephones, including mobile telephones and cordless telephones, and computers and computer-related devices and components, such as printers, network-connected machinery such as a circuit generating system 404, and/or any other suitable device or third-party device.

Wired communication modes comprise any mode of communication between points that utilize wired technology including various protocols and combinations of protocols associated with wired transmission, data, and devices. The points comprise, for example, devices such as audio and multimedia devices and equipment, such as audio players and multimedia players, telephones, including mobile telephones and cordless telephones, and computers and computer-related devices and components, such as printers, network-connected machinery, and/or any other suitable device or third-party device. In various implementations, the wired communication modules may communicate in accordance with a number of wired protocols. Examples of wired protocols may comprise Universal Serial Bus (USB) communication, RS-232, RS-422, RS-423, RS-485 serial protocols, FireWire, Ethernet, Fiber Channel, MIDI, ATA, Serial ATA, PCI Express, T-1 (and variants), Industry Standard Architecture (ISA) parallel communication, Small Computer System Interface (SCSI) communication, or Peripheral Component Interconnect (PCI) communication, to name only a few examples.

Accordingly, in various aspects, the communications interface 410D may comprise one or more interfaces such as, for example, a wireless communications interface, a wired communications interface, a network interface, a transmit interface, a receive interface, a media interface, a system interface, a component interface, a switching interface, a chip interface, a controller, and so forth. When implemented by a wireless device or within wireless system, for example, the communications interface 410D may comprise a wireless interface comprising one or more antennas, transmitters, receivers, transceivers, amplifiers, filters, control logic, and so forth.

In various aspects, the communications interface 410D may provide voice and/or data communications functionality in accordance a number of wireless protocols. Examples of wireless protocols may comprise various wireless local area network (WLAN) protocols, including the Institute of Electrical and Electronics Engineers (IEEE) 802.xx series of protocols, such as IEEE 802.11a/b/g/n, IEEE 802.16, IEEE 802.20, and so forth. Other examples of wireless protocols may comprise various wireless wide area network (WWAN) protocols, such as GSM cellular radiotelephone system protocols with GPRS, CDMA cellular radiotelephone communication systems with 1×RTT, EDGE systems, EV-DO systems, EV-DV systems, HSDPA systems, and so forth. Further examples of wireless protocols may comprise wireless personal area network (PAN) protocols, such as an Infrared protocol, a protocol from the Bluetooth Special Interest Group (SIG) series of protocols, including Bluetooth Specification versions v1.0, v1.1, v1.2, v2.0, v2.0 with Enhanced Data Rate (EDR), as well as one or more Bluetooth Profiles, and so forth. Yet another example of wireless protocols may comprise near-field communication techniques and protocols, such as electro-magnetic induction (EMI) techniques. An example of EMI techniques may comprise passive or active radio-frequency identification (RFID) protocols and devices. Other suitable protocols may comprise Ultra Wide Band (UWB), Digital Office (DO), Digital Home, Trusted Platform Module (TPM), ZigBee, and so forth.

In some embodiments, the controller 410 of the system 400 may comprise a system bus 410E that couples various system components including the processor 410A, the memory 410B, and the I/O interface 410C. The system bus 410E can be any of several types of bus structure(s) including a memory bus or memory controller, a peripheral bus or external bus, and/or a local bus using any variety of available bus architectures including, but not limited to, 9-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect Card International Association Bus (PCMCIA), Small Computers Interface (SCSI) or other proprietary bus, or any custom bus suitable for computing device applications.

The controller 410 is connected to at least one optical detector 402, as well as the plurality of motors 404, decoder 406 and trigger sensor 408, respectively. In some embodiments, the controller 410 may also comprise a programmable light source. In some embodiments, the controller 410 may also comprise a local display and a control panel. The controller 410 can be connected to a local or a remote computer 414 through the communication interface 410D. The computer 414 can be then connected to a display 412 to configure scan recipe, program analysis parameters, display raw data, reconstructed images, and user interfaces of software programs 416. The software program 416 for data analysis will be further discussed in detail in FIG. 5.

Figure 5:
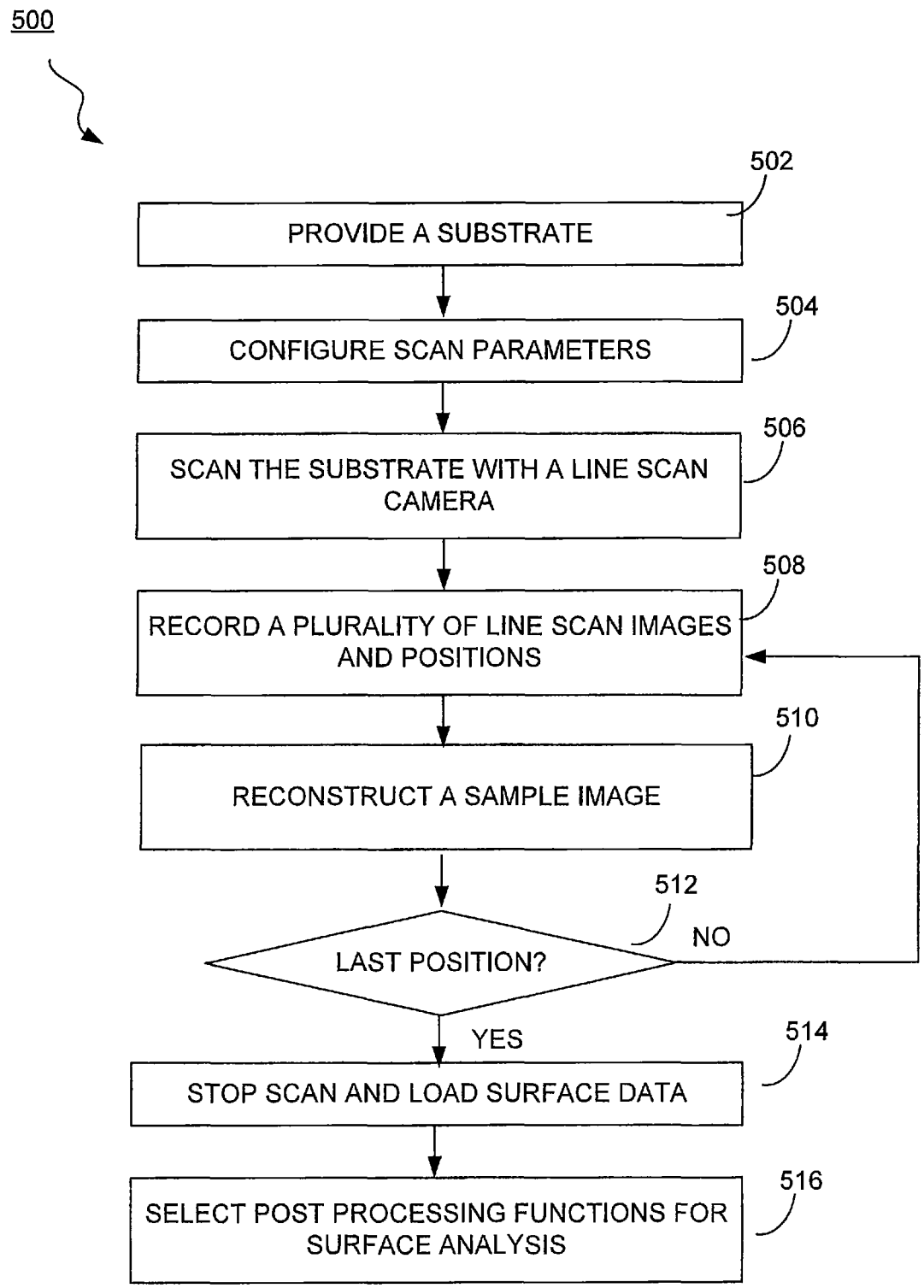
FIG. 5 illustrates a flowchart of a method of defection inspection of a substrate surface, in accordance with some embodiments of the present disclosure.

FIG. 5 illustrates a flowchart of a method 500 of defect inspection of a substrate surface, in accordance with some embodiments of the present disclosure. It is understood that additional operations may be provided before, during, and after the method 500 of FIG. 5, and that some operations may be omitted or reordered.

The method 500 starts with operation 502 in which a substrate is provided according to some embodiments. In some embodiments, the substrate is provided to an inspection station 104 after a semiconductor manufacturing process conducted in a processing station 102. Examples of the semiconductor manufacturing process include cleaning, photolithography, wet etching, dry etching, dielectric deposition, metal deposition, and processes known in the art. In some embodiments, the substrate contains at least one feature including a metal contact, etch trench, an isolation, an interconnect line and the like. In some embodiments, the at least one feature also includes a hole.

In some embodiments, the inspection system 104 includes a transport system (e.g., a conveyor or a pair of tracks), a line scan camera, and a local computer with a storage unit and a display unit. In some embodiments, the transport system can be used to transport the substrate. In some other embodiments, the transport system can be used to transport the line scan camera.

In some embodiments, the inspection system 104 comprises a pair of tracks 122A and 122B that guide a movement of an optical detector 130 in a first horizontal direction (i.e., X-direction), and a track 124 that guides a movement of the optical detector 130 in a second horizontal direction (i.e., Y-direction) that is normal to the first horizontal direction (e.g., X-direction). In some embodiments, the optical detector 130 is a line scan camera. The X-Y plane can be parallel to the plane of a stage 132, on which a part to be inspected can be placed. Motors 126 and 128 provide linear movements in the X- and Y-direction such that the optical detector 130 in the X-Y plane can scan the surface of a wafer (not shown) on the stage 132. In some embodiments, the optical detector 130 can also move in a third vertical direction (e.g., Z-direction) that is perpendicular to the X-Y plane on a track 134 controlled by a motor 126. In some embodiments, the motors 126, 128, and 136 can be linear electric motors providing high speed linear motion and accurate position control of the optical detector 130.

In some embodiments, a plurality of optical detectors 130 can be used to scan complex surfaces to simultaneously scan multiple wafers or multiple locations on a same surface. In some other embodiments, the wafer under inspection can be moved on a conveyor stage/a robot arm, while the optical detector 130 is fixed.

In some embodiments, instead of capturing an image of the entire wafer as a whole, the line scan camera 202 collects image data one scan line at a time. An image line 212, indicated by a short dashed line in FIG. 2A, is a line region where the reflected or scattered light from the surface of the wafer under inspection is collected by a light sensor in the line scan camera 202 through the imaging lens 203. In some embodiments, the field of view 218 of the line scan camera 202 in the Y direction, e.g., the maximum length of the image line 212, can be adjusted by the width of the light sensor in the line scan camera 202, the working distance 209, and the focal length of the lens 203. In some embodiments, the image line 212 is the overlap portion of the field of view 218 in Y direction and the surface of the wafer 206. For example, the width of imaging lens can be 25 millimeters (mm), which can provide a field of view 218 with a width of up to 215 mm in the Y direction and a sensor width of 14 mm. Therefore, the resolution in the Y direction, which has a unit in mm per pixel for a light sensor width of 1024 pixels per line, can be controlled by the working distance 209 taking into account the diameter of the wafer 206. In some other embodiments, the line scan cameras comprising light sensors with different width and numbers of pixels can be used and are within the scope of this disclosure. In some embodiments, the resolution that such system can provide is 9 micrometer.

In some embodiments, the line scan camera 202 includes a light sensor that can be based on a variety of technologies such as, for example, a charge-coupled detector (CCD), a complementary metal-oxide-semiconductor (CMOS), or a hybrid CCD/CMOS architecture. In some embodiments, the light sensor can be a mono or color sensor. In some embodiments, such light sensor can be configured to either work in a broad range of wavelengths or a narrow range of wavelengths e.g., ultraviolet light, visible light, infrared light, x-ray and/or other appropriate wavelengths. In some other embodiments, such light sensor can be configured to receive either reflected and/or scattered non-fluorescence light from a light source or a fluorescence light emitted by the defects or features due to an excitation by the light source.

In some embodiments, the substrate 206 includes a silicon substrate. Alternatively, the wafer 206 may include other elementary semiconductor material such as, for example, germanium. The substrate may also include a compound semiconductor material such as silicon carbide, gallium arsenide, indium arsenide, and indium phosphide. Furthermore, the wafer 206 may include an alloy semiconductor material such as silicon germanium, silicon germanium carbide, gallium arsenic phosphide, and gallium indium phosphide. Each material may interact differently with the incident light from the light source due to different material properties, e.g., refractive index and extinction coefficient, which can affect the design of the illumination source and the light sensor, e.g., wavelength, sensitivity and mode (e.g., scattered, reflected light or fluorescence light), as well as the speed of the conveyor.

The method 500 continues to operation 504 in which scan parameters are configured according to some embodiments.

In some embodiment, this configuration includes a process of writing an inspection recipe or recalling an existing recipe to an inspection operation, which contains inspection system parameter settings for a particular type of substrate, feature, or defect to be inspected. In some embodiments, operation 604 also includes configuration of the controller 410 which controls the motion of the line scan camera 130 relative to the substrate, e.g., speed and direction. In some embodiments, inspection parameters include trigger criteria, inspection resolution, line frequency, pixel frequency, total acquisition time, illumination intensity, moving speed of the linear motors 124/126/136, speed of the conveyor 210, size of the substrate 206, and/or other suitable parameters.

The method 500 continues to operation 506 in which the substrate is scanned by a line scan camera in according to some embodiments. In some embodiments, the substrate is scanned by the line scan camera, while being transported by the conveyor at a constant speed along a direction perpendicular to the line scan direction, as discussed above with respect to FIGS. 2 and 3, for example. In some embodiments, the line scanning can be triggered by the controller 410 which acquires position parameters from the encoder located on the conveyor. In some other embodiments, the substrate is held steady on the stage 132 and scanned by the line scan camera which is transported on a pair of tracks 122 along the direction perpendicular to the line scan direction, as discussed in FIG. 1B.

The method 500 continues to operation 508 in which a plurality of line scan images are recorded by the line scan camera according to a scanning process illustrated in FIG. 3. In some embodiments, each of the plurality of line scan images obtained from the line scan camera is recorded together with corresponding position (e.g., X-, Y- and Z-coordinates).

The method 500 continues with operation 510 in which a sample image is reconstructed according to some embodiments. In some embodiments, the plurality of line scan images is converted from analog signals to digital signals and stored in a local computer, followed by operation 508, during which a sample image is reconstructed based on the plurality of line scan images and preprocessed once a scanning of the surface of the first wafer is completed. In some embodiments, operation 510 includes at least one of the processes such as, for example, offset correction, gain correction, distortion correction, adjusting contrast, and the like. In some embodiments, the preprocessed sample image can be displayed on a local display monitor which is coupled to a local computer. In some embodiments, the display monitor can be also a touch screen for inputting and displaying inspection parameters.

In some embodiments, the line speed of the line scan camera is determined by the speed of the conveyor. In another embodiment, the resolution requirement of the line scan camera can be determined by the type of defects that are interested or are potentially introduced in a respective step of the manufacturing production line.

The method 500 continues with operation 512 in which a last position is determined according to some embodiments. When the position is not the last position for performing a line scan, the method 500 continues with operations 508 and 510, wherein a plurality of line scan images are collected a second position. When the position is determined as the last position for performing a line scan on the substrate, the method 500 continues with operation 514, in which the scan is terminated, a complete surface data is loaded onto the local computer.

The method 500 continues with operation 516 in which post-processing functions can be selected for quantitative analysis of the surface features according to some embodiments. Functions include but are not limited to, measurement of diameter, roundness, raw edge, consumption, contamination and the like.

FIGS. 6A-6D illustrate schematics of a hole feature during a post-processing analysis, in accordance with some embodiments of the present disclosure. In some embodiments, the post-processing analysis fits a theoretical circle to the hole feature. In some embodiments, the post-processing analysis determines the center 602 of a theoretical circle and the radius 604 (Rtheory) of the theoretical circle, according to a predetermined algorithm. In some embodiments, the hole feature 600 comprises defects 606 on the edge, i.e., a first defect 606-1, a second defect 606-2, a third defect 606-3, and a fourth defect 606-4. In the illustrated embodiment, the distance (Rreal) between the actual edge of the hole feature at the first defect 606-1 or the fourth defect 606-4 and the center 602 of the theoretical hole is less than the radius 604 of the theoretical circle, i.e., Rreal<Rtheory or ΔR=Rreal−Rtheory<0. Similarly, in the illustrated embodiment, the distance between the actual edge of the hole feature at the second defect 606-2 or the third defect 606-3 and the center 602 of the theoretical circle is greater than the radius 604 of the theoretical circle model, i.e., Rreal>Rtheory or ΔR=Rreal−Rtheory>0. In some embodiments, the roundness is defined as below $$\text{Roundness} = \frac{\sqrt{\sum (R_{real} - R_{thoery})^2}}{N}$$

wherein N is the number of measurements that are made and is a positive integer, e.g. N=1000, where Rreal is measured.

Using the third defect 606-3 and the fourth defect 606-4 as examples, Rreal 612-1 of the third defect 606-3 is greater than Rtheory 604 and the difference between Rreal 612-1 and Rtheory 604 is thus a positive value. Similarly, the Rreal 612-2 of the fourth defect 606-4 is less than Rtheory 604 and the difference between Rreal 612-2 and Rtheory 604 is a negative value.

In the illustrated embodiments, the absolute values of ΔR 622 in micrometer at each position of the edge of the hole feature can be plotted against the radian 624 in degree. In some embodiments, ΔR 622 is also known as a contamination value. Four peaks 626-1, 626-2, 626-3 and 626-4 correspond to the first defect 606-1, the second defect 606-2, the third defect 606-3 and the fourth defect 606-4. In the illustrated embodiments, the ΔR values 622 of the four defects are all greater than 10 micrometer. The angle (θ) 628-1, 628-2, 628-3 and 628-4 of corresponding peaks 626-1, 626-2, 626-3 and 626-4 at a ΔR 622 value of 10 micrometer can be then determined, which can be further used to determine the arc length (S) of the corresponding defects can be determined using the equation below $$S = R_{real} \frac{\pi \theta}{180}$$

wherein S is the arc length at the corresponding defects in micrometer, R is the radius in micrometer, and θ is the angle in degree.

A raw edge length is determined using the equation below $$D_{raw,sum} = \Sigma S$$

In the illustrated embodiment, Draw,sum=S1+S2+S3+S4, wherein S1, S2, S3, S4 are the arc length of defects at ΔR 622 value of 10 micrometer.

Figure 6A:
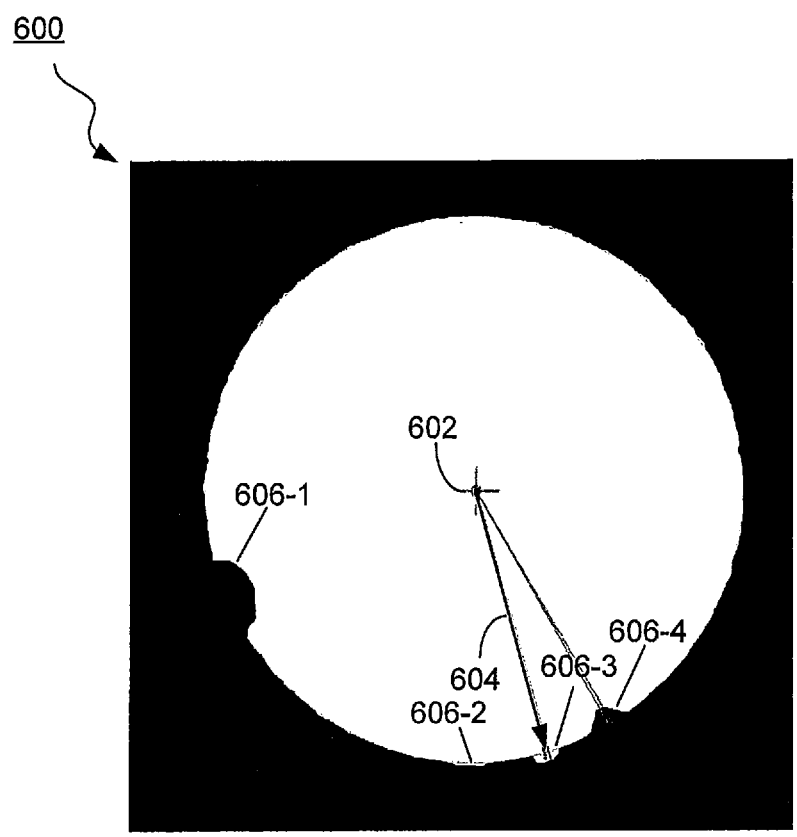
FIGS. 6A-6E illustrate schematics of a hole feature during a post-processing analysis, in accordance with some embodiments of the present disclosure.
Figure 6B:
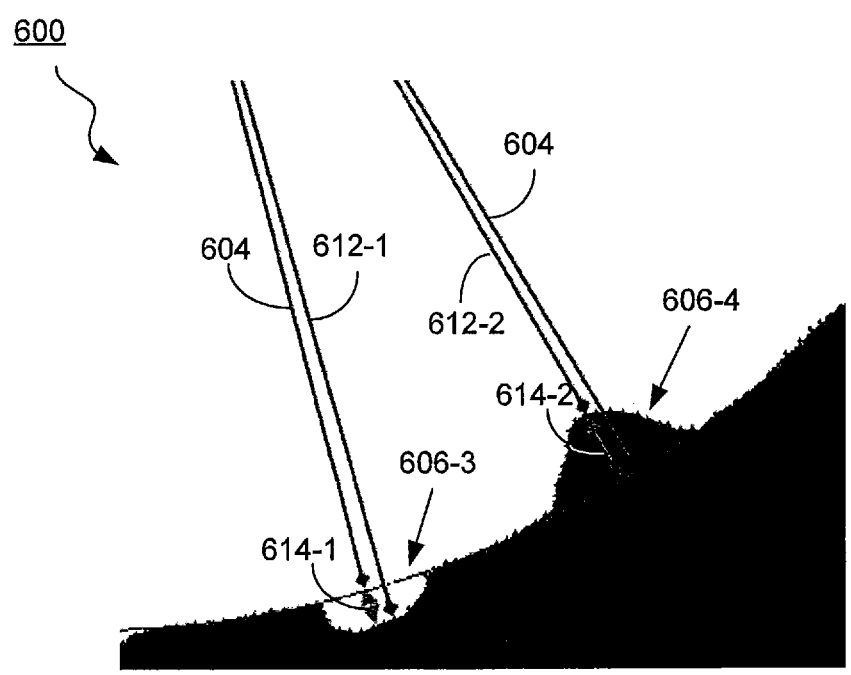
Figure 6C:
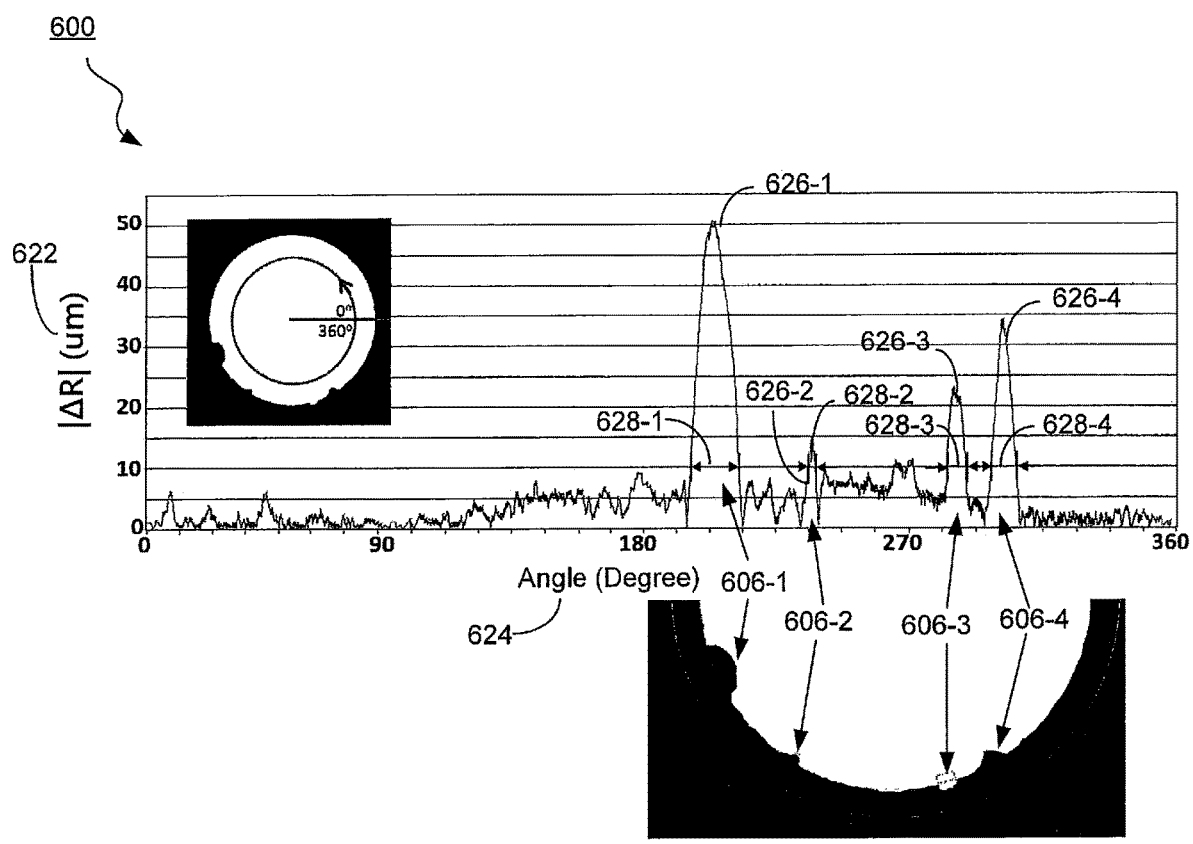
Figure 6D:
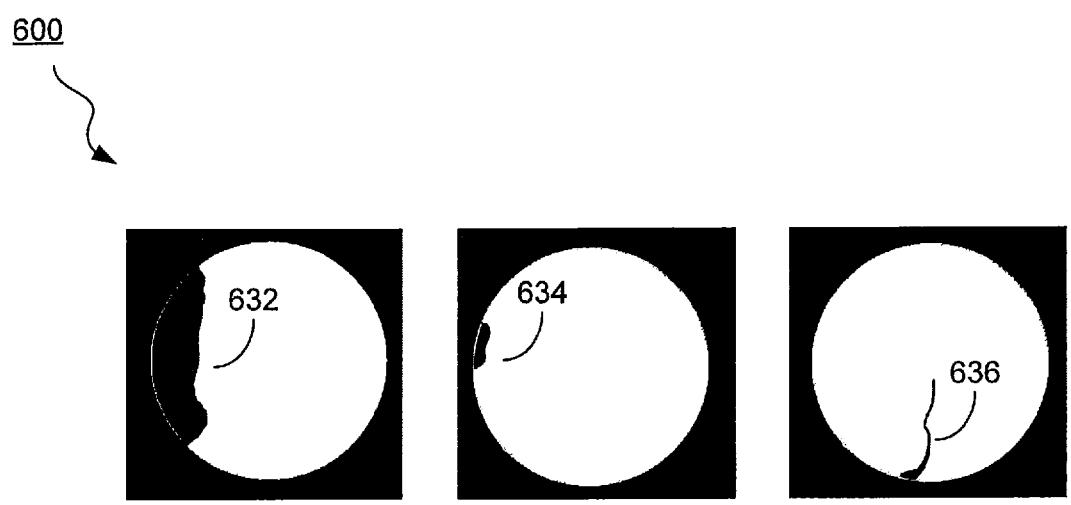
Figure 6E:
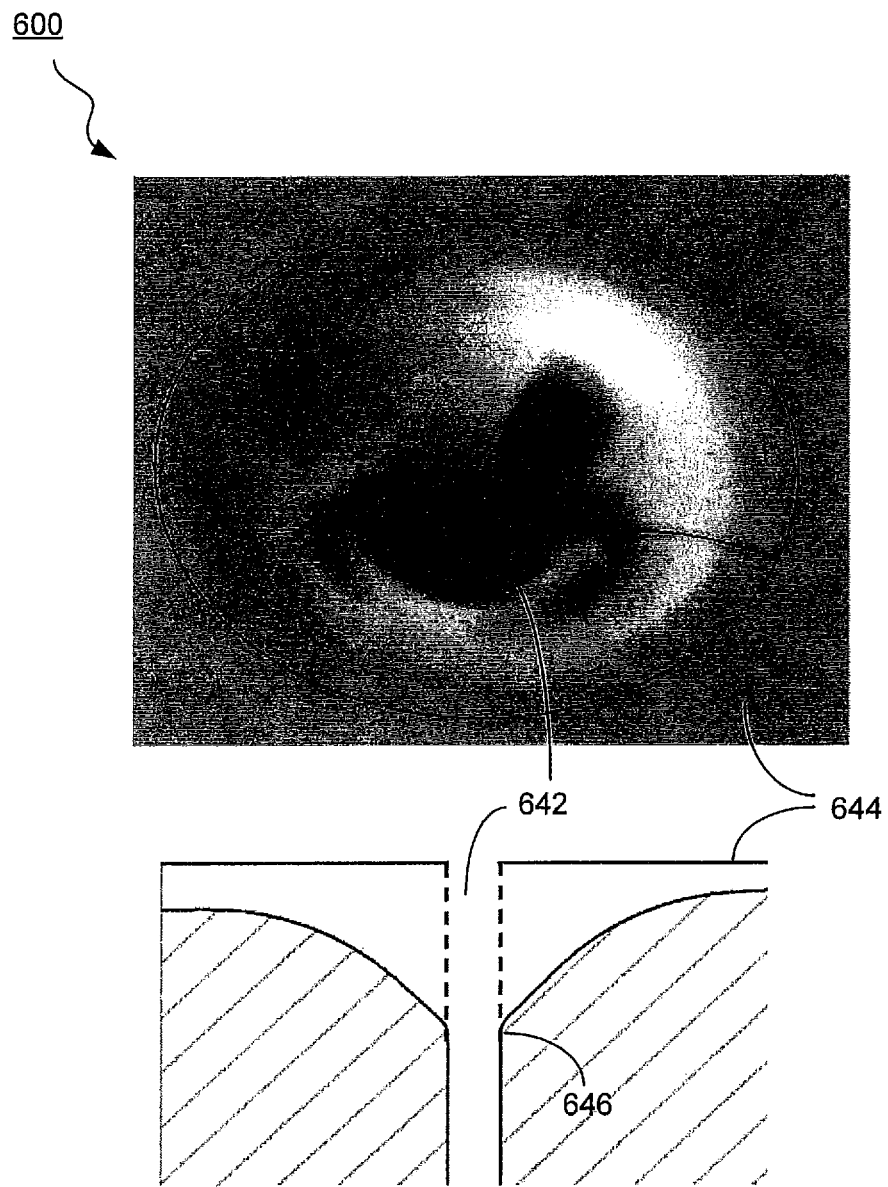

Further, a raw edge ratio can be determined using the equation below $$Ratio_{raw\ edge} = \frac{D_{raw,sum}}{C}$$

wherein C is the circumference in micrometer of the theoretical circle model. The raw edge ratio is used to determine the arc length of defects that is over a threshold value (e.g., ΔR 522 value of 10 micrometer). As illustrated in FIG. 6D, three defects 632, 634 and 636 are hypothetically configured separately in a hole feature 600. Assuming ΔR 522 values of the three defects are greater than 10 micrometers. The arc length of the defect 632 is greater than the arc length of the defect 634, which is greater than the arc length of the defect 636. Therefore, the raw edge ratio of the defect 632 is greater than the raw edge ratio of the defect 634, which is greater than the raw edge ratio of the defect 636.

In some embodiments, a consumption value of an underformed hole feature 642 (e.g., under etched during an etching process or under developed during a photolithography process) is determined by the difference between the top surface 644 of the hole feature and position 646 of the hole feature 642.

FIG. 7 illustrates a user interface 700 of a software program that is used for post-processing surface images, in accordance with some embodiments of the present disclosure. A user can use this interface to define post-processing analysis threshold values to determine if a surface fails which needs to be reprocessed or passes which can be further processed in following processes. In the illustrated embodiment, the user interface 700 allows user to specify the roundness value 702, ΔR value 704 for determining Raw edge length, raw edge ratio 706/708/710, contamination value 712 and pixel calibration ratio 714.

In one embodiment, the pixel calibration ratio 714 corresponds to each pixel of the camera and is calculated based on a calibration sheet and a machine, e.g. an acrylic fixture. For example, an image calibration may start after a calibration sheet is placed in the center of the acrylic fixture, and may include: taking a calibration image, drawing a straight line to calculate a ratio between the pixel and the length, and saving it as the pixel calibration ratio 714. In one embodiment, after clicking to start image calibration, the motor will move to the center of the acrylic fixture. Then a clear calibration scale can be found using a motor control page. Then an image is taken and the system automatically switches to the image calculation tab. One can use a pull line to roughly draw a straight line of a fixed length, with the starting point and the end point on the same side of the scale. After zooming in, one can use the pull line function to adjust the positions of the starting point and/or the end point. After the scale reading on the calibration sheet is entered, the system can calculate the image calibration ratio and store it as the pixel calibration ratio 714.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the inventive concepts, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is set to be understood in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

In an embodiment, a method for defect detection in a hole array on a substrate, includes: scanning a substrate surface using at least one optical detector, generating at least one image of the substrate surface; and analyzing the at least one image to detect defects in the hole array on the substrate surface based on a set of predetermined criteria.

In another embodiment, an inspection station for defect detection in a hole array on a substrate, includes: an optical detector configured to scan a substrate surface and generate at least one image of the substrate surface; a transport mechanism configured to transport the optical detector so as to scan the substrate surface; and at least one processor configured to receive the at least one image from the optical detector and analyze the at least one image to detect defects on the substrate surface based on a set of pre-determined criteria.

Yet, in another embodiment, a system for defect detection in a hole array on a substrate, includes: a first processing station for performing a first semiconductor manufacturing process; a second processing station for performing a second semiconductor manufacturing process; an inspection station coupled between the first and the second processing station for transporting the substrate between the first and the second processing stations, wherein the inspection station comprises: an optical detector configured to scan a substrate surface and generate at least one image of the substrate surface; a transport mechanism configured to transport the optical detector so as to scan the substrate surface; and at least one processor configured to receive the at least one image from the optical detector and analyze the at least one image to detect defects on the substrate surface based on a set of pre-determined criteria.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A method for defect detection in a hole array on a substrate, comprising:
    scanning a substrate surface using at least one optical detector,
    generating at least one image of the substrate surface; and
    analyzing the at least one image to detect defects in the hole array on the substrate surface based on a comparison between at least one first distance and a second distance, wherein
        the at least one first distance is determined based on at least one actual edge of the hole array and a center of a theoretical hole model, and
        the second distance is determined based on a radius of the theoretical hole model.

2. The method of claim 1, wherein the scanning further comprises:
    transporting the at least one optical detector using a transport mechanism.

3. The method of claim 2, wherein the transport mechanism comprises at least one linear motor.

4. The method of claim 1, wherein each of the at least one optical detector comprises a line scan camera, wherein the line scan camera scans the substrate surface one pixel line at a time.

5. The method of claim 1, wherein the generating further comprises:
    providing pixel data from the optical detector to a local processor coupled to the optical detector;
    generating the at least one image of the substrate surface by processing the pixel data; and
    displaying the at least one image of the substrate surface on a display monitor coupled to the local processor.

6. The method of claim 1, further comprising:
    illuminating the wafer surface using a light source.

7. The method of claim 6, wherein the light source comprises a line light source that only illuminates a line portion of the substrate surface at one time.

8. An inspection station for defect detection in a hole array on a substrate, comprising:

at least one optical detector configured to scan a substrate surface and generate at least one image of the substrate surface;

a transport mechanism configured to transport the at least one optical detector so as to scan the substrate surface; and at least one processor configured to receive the at least one image from the at least one optical detector and analyze the at least one image to detect defects on the substrate surface based on a comparison between at least one first distance and a second distance, wherein the at least one first distance is determined based on at least one actual edge of the hole array and a center of a theoretical hole model, and the second distance is determined based on a radius of the theoretical hole model.

9. The system of claim 8, wherein each of the at least one optical detector comprises a line scan camera, wherein the line scan camera scans the substrate surface one pixel line at a time.

10. The system of claim 8, wherein the transport mechanism comprises at least one linear motor.

11. The system of claim 8, further comprising:
a light source to illuminate the wafer surface.

12. The system of claim 11, wherein the light source comprises a line light source that only illuminates a line portion of the wafer surface at one time.

13. The system of claim 8, wherein each of the at least one processor is configured to:
receive a pixel data from the at least one optical detector;
preprocess the pixel data to regenerate the at least one image of the substrate surface; and
display the at least one image of the substrate surface on a display monitor.

14. The system of claim 8, wherein the at least one processor is further configured to:
receive the at least one image of the substrate surface; and
analyze the at least one image of the substrate surface.

15. A system for defect detection in a hole array on a substrate, comprising:
a first processing station for performing a first semiconductor manufacturing process;
a second processing station for performing a second semiconductor manufacturing process;
an inspection station coupled between the first and the second processing station for transporting the substrate between the first and the second processing stations, wherein the inspection station comprises:

at least one optical detector configured to scan a substrate surface and generate at least one image of the substrate surface;

a transport mechanism configured to transport the at least one optical detector so as to scan the substrate surface; and at least one processor configured to receive the at least one image from the at least one optical detector and analyze the at least one image to detect defects on the substrate surface based on a comparison between at least one first distance and a second distance, wherein the at least one first distance is determined based on at least one actual edge of the hole array and a center of a theoretical hole model, and the second distance is determined based on a radius of the theoretical hole model.

16. The system of claim 15, wherein each of the at least one optical detector comprises a line scan camera, wherein the line scan camera scans the substrate surface one pixel line at a time.

17. The system of claim 15, wherein the transport mechanism comprises at least one linear motor.

18. The system of claim 15, further comprising:
a light source to illuminate the substrate surface, wherein the light source comprises a line light source that only illuminates a line portion of the substrate surface at one time.

19. The system of claim 15, wherein each of the at least one processor is configured to:
receive a pixel data from the at least one optical detector;
preprocess the pixel data to obtain the at least one image of the substrate surface; and
display the at least one image of the substrate surface on a display monitor.

20. The system of claim 15, wherein the at least one processor is further configured to:
receive the at least one image of the substrate surface; and
analyze the at least one image of the substrate surface.

* * * * *